United States Patent [19]

Zega

[11] 4,374,722
[45] Feb. 22, 1983

[54] CATHODIC SPUTTERING TARGET INCLUDING MEANS FOR DETECTING TARGET PIERCING

[75] Inventor: Bogdan Zega, Geneva, Switzerland

[73] Assignee: Battelle Development Corporation, Columbus, Ohio

[21] Appl. No.: 290,425

[22] Filed: Aug. 6, 1981

[30] Foreign Application Priority Data

Aug. 8, 1980 [EP] European Pat. Off. ........ 80200752.6

[51] Int. Cl.³ ............................................. C23C 15/00
[52] U.S. Cl. .................................. 204/298; 204/192 R
[58] Field of Search ................. 204/192 R, 192 C, 298

[56] References Cited

U.S. PATENT DOCUMENTS

| | | | |
|---|---|---|---|
| 3,855,110 | 12/1974 | Quinn et al. ........................ | 204/298 |
| 3,884,793 | 5/1975 | Penfold et al. ...................... | 204/298 |
| 3,995,187 | 11/1976 | Penfold et al. ................. | 313/346 R |
| 4,030,996 | 6/1977 | Penfold et al. ................. | 204/192 R |
| 4,031,424 | 6/1977 | Penfold et al. ..................... | 313/146 |
| 4,041,353 | 8/1977 | Penfold et al. ...................... | 315/267 |
| 4,179,351 | 12/1979 | Hawton, Jr. et al. ................ | 204/298 |
| 4,221,652 | 9/1980 | Kuriyama ........................... | 204/298 |

Primary Examiner—Aaron Weisstuch
Attorney, Agent, or Firm—Barry S. Bissell

[57] ABSTRACT

The sputtering cathode (10) forming part of the apparatus of the invention essentially comprises a target (20) made of a material to be sputtered, arranged in front of an intermediate support (15) so as to define a first gas tight chamber (30) of narrow thickness therebetween, intended to be provided with an atmosphere of a gas (37) presenting a high thermal conductivity (under a pressure substantially higher than that prevailing inside the vacuum chamber of the apparatus). The intermediate support (15) in turn forms part of the wall of a second tight chamber adjoining said first tight chamber, which is intended to be circulated with a liquid coolant therewithin. The above arrangement enables the sputtering target (20) to be consumed up to its piercing without causing any damage for the apparatus and/or the substrates being coated, since this piercing will result in a simple gas irruption inside the vacuum chamber (3), which may be at once detected for immediately controlling the automatic shut-off of the sputtering operation. The above arrangement further enables sufficient target cooling throughout the sputtering.

10 Claims, 7 Drawing Figures

CATHODIC SPUTTERING TARGET INCLUDING MEANS FOR DETECTING TARGET PIERCING

FIELD OF THE INVENTION

The present invention is an apparatus for detecting target piercing in high-rate cathodic sputtering processes, while sufficiently insuring target cooling throughout the sputtering.

BACKGROUND OF THE INVENTION

The recent development of high-rate cathodic sputtering, such as those obtained using magnetic fields (magnetically enhanced sputtering), is presently providing a major contribution to the coating field, and renders possible the production of coatings on an industrial scale for many applications.

The major problem of optimal consumption of the sputtering target, and the requirement of an essentially continuous production in industrial manufacturing gives rise to a fast consumption of the sputtering target as the consumption proceeds to the piercing of the target, which may cause irremediable damage in all known high-rate sputtering systems.

All known high-rate sputtering systems are designed to ensure proper target cooling which is rendered indispensible because of the high power dissipation and have either of these two basic designs:

"direct cooling" arrangement where the liquid coolant is circulated directly along the back of the sputtering target, in which case the target piercing causes some irremediable damage inside the vacuum bell jar by flooding it with the coolant (there is also a risk of premature target piercing because of the high differential pressure directly exerted by the coolant on the target), and, "indirect cooling" arrangement where the liquid coolant is circulated along an intermediate support against which the target is mounted (the target being in contact with the intermediate support, or bonded to it by any suitable means), in which case the target piercing would cause the sputtering of the intermediate support instead of the target, causing irremediable damaging of the substrate; notwithstanding the other drawbacks of an intermediate support, such as high manufacturing costs of a target to be bonded against the intermediate support, or lack of a good thermal contact (likely to be aggravated by thermal dilation) of a target to be maintained in contact against the intermediate support.

Since the exact instant of target piercing is unforeseeable, the only solution for avoiding irremediable damage to the apparatus or the coated substrates requires coupling the partially consumed sputtering target wall before its piercing, resulting in more frequent interruptions in the manufacturing process, and significant material losses. These losses are enhanced when the target material is very rare or when the target material is difficult to work into the desired shape.

OUTLINE OF THE INVENTION

The present invention has the object of remedying these drawbacks, by proposing a design for high-rate cathodic sputtering which enables the target to be sputtered without damage up to its piercing, while enabling a proper target cooling throughout the sputtering.

The present invention involves an apparatus for coating substrates by high-rate cathodic sputtering, which comprises an evacuable sealed enclosure; means for evacuating the enclosure and for providing therein a rarefied gas atmosphere at a pressure capable of sustaining a glow discharge; at least one sputtering cathode and one anode distant from each other, disposed at least partially inside the enclosure or forming part thereof; means for establishing between the sputtering cathode and the anode a potential difference sufficient for generating a glow discharge therebetween; and means for enhancing the sputtering about the cathode, so as to cause a high sputtering rate, wherein the sputtering cathode comprises:

a target made of a material to be sputtered, presenting two major opposing faces of which one is designed for constituting a sputtering face, an intermediate support arranged in front of the face of the target opposed to the sputtering face, in such a manner as to define in combination therewith a thin first tight chamber, the intermediate support in turn forming part of the wall of a second tight chamber arranged adjacent to the first tight chamber, means for providing inside the first tight chamber an atmosphere of a gas of high thermal conductivity, at a pressure higher than that prevailing in the sealed enclosure, and, means for circulating a liquid coolant within the second tight chamber, and wherein the apparatus further comprises:

means for detecting a sudden irruption, inside the sealed enclosure, of the high thermally-conducting gas normally contained inside the first tight chamber, and, means for controlling the switch-off of the apparatus when the sudden irruption of gas is detected, whereby enabling the target to be sputtered up to its piercing without damage to the apparatus and/or substrates while enabling a proper target cooling throughout the sputtering.

The present invention also relates to a sputtering cathode for the apparatus.

In the present specification, the expression "high-rate cathodic sputtering" means any type of cathodic sputtering process (non-reactive or reactive sputtering, and/or direct-current or radio-frequency sputtering) that involves sputtering rates much higher than those obtainable with conventional sputtering; or at least any type of cathodic sputtering process in which the target consumption is carried out at a rate sufficiently high for raising the problem of its periodic replacement. The enhanced-sputtering processes include the use of magnetic fields inside the interspace cathode-anode of the sputtering apparatus (magnetically enhanced sputtering), which magnetic fields may assume various configurations: axial uniform magnetic fields, such as the Penning-type (constituted by Helmholtz-type coils disposed outside the vacuum bell jar), or tunnel-shaped magnetic fields extending in a closed path adjacent to the sputtering target, such as those generated by the "planar" or "cylindrical magnetrons" (constituted by appropriate magnet assemblies arranged behind the back of the intermediate support). The "cylindrical magnetrons" includes a heretofore new apparatus as disclosed herein and shown in FIGS. 1, 2, 3, 4, and 6.

The enhanced-sputtering processes also include means other than magnetic means, such as triode sputtering.

An essential feature of the present invention is the interposition of a thin layer of a stagnant gas with a high thermal conductivity between the conventional liquid cooling circuit and the back of the sputtering target, the function of which is to enable the consumption of the target up to its piercing without causing any damage to the sputtering apparatus and the substrates being coated, while providing target cooling throughout the sputtering.

The interposition of a stagnant gas layer presents the major advantage of enabling a totally harmless detection of the exact instant of piercing of the sputtering target; since this piercing will result in a simple irruption of gas inside the vacuum bell jar, which can be detected for immediately controlling the automatic switch-off of the sputtering apparatus while allowing an optimal consumption of the sputtering target, and a completely automatic operation (except for the replacement of the pierced target).

The detection of the gas irruption may be performed by determining the sudden pressure variations likely to occur at the instant of target piercing (sudden rise of pressure inside the vacuum bell jar or sudden decrease of pressure inside the chamber normally containing the stagnant gas layer), by using means for measuring the pressure prevailing at any instant inside the vacuum bell jar or inside the chamber normally containing the stagnant gas layer. The detection may also be carried out by observing the appearance of the characteristic light likely to be emitted at the instant of target piercing (characteristic light likely to be emitted by said high thermally-conducting gas when undergoing an electrical discharge at its entrance inside the vacuum bell jar), by using adequate spectroscopical means (such as a photoelectric cell fitted with an appropriate optical filter) for determining the appearance of the characteristic light. The pressure of the interposed stagnant gas layer will be substantially higher than the pressure in the vacuum bell jar (pressure in the bell jar is about $10^{-4}$ to $10^{-2}$ torr for sustaining the glow discharge), so as to give rise to detectable pressure variations at the time of the target piercing. A pressure that is too high could result in a premature target piercing if there exists a too high differential pressure as the target becomes progressively thinner. The pressure of the interposed stagnant gas layer should be between $10^{-1}$ and 200 torr, the preferred range being between 1 and 10 torr.

The interposition of an additional stagnant gas layer between the sputtering target and the liquid coolant circuit also ensures target cooling throughout the sputtering provided that the gas has a sufficiently high thermal conductivity combined with a sufficiently thin gas layer, which allows a heat flow through the gas layer which is high enough to maintain the temperature of the sputtering target to acceptable values.

The sputtering target can tolerate temperature rises up to values of about 500° C. witout causing any damage to the sputtering process since such values will be too low generally to cause deterioration (cracking, sublimation or melting) of the sputtering target, and a too prohibitive radiative heating of the substrates being coated (radiative heating is proportional to the fourth power of the temperature, which remains tolerable for values of about 500° C.).

It is furthermore known that the heat flow per unit time and unit area "dQ/dt" through a gas layer of thickness "e" stagnating between two plates with respective temperatures "T" and "$T_o$" obeys the general relation:

$$dQ/dt = k(T - T_o)/e$$

where k designates the thermal conductivity of the gas, which is independent of the pressure, provided that the pressure substantially exceeds a minimum value from which the mean free path of the gas becomes of the same order as the distance separating the plates between which the heat is transported. This condition is fully met with the values described in the present invention.

Therefore, despite the high power dissipation at the target encountered in high-rate sputtering (power dissipation typically of the order of 20 Watt/cm$^2$), the temperature of the target may be kept below the maximum permissible values (typically below values of about 500° C.), by choosing, for the interposed stagnant gas layer, a gas having a high thermal conductivity such as helium ($k = 333 \times 10^{-6}$ cal/sec $\times$ cm $\times$ ° C. at 20° C., hydrogen ($k = 405 \times 10^{-6}$ cal/sec $\times$ cm $\times$ ° C. at 20° C.), neon ($K = 107 \times 10^{-6}$ cal/sec $\times$ cm $\times$ ° C. at 20° C.), together with thin gas layers of about 0.05 and 1 mm (the preferred range between 0.1 and 0.3 mm).

The sputtering cathode and apparatus of the present invention may be designed to assume various geometries because of different coating applications amongst which are cylindrical and planar configurations. These cylindrical configurations may assume one of the following types:

an apparatus with a central cylindrical sputtering cathode, designed for coating substrates disposed concentrically outside the central cathode (for instance, single tubular substrate disposed coaxially around the cathode so as to be internally coated, or a plurality of planar substrates disposed equiangularly around the cathode). The central sputtering cathode will consist of a tubular sputtering target arranged coaxially outside a tubular intermediate support, so as to define a thin annular tight chamber that is filled with gas of high-thermal conductivity (the inside of the tubular intermediate support being able to constitute a second tight chamber with an appropriate liquid coolant circulated therein, such as cold water);

an apparatus with a hollow cylindrical sputtering cathode, designed for coating substrates inserted axially inside the hollow cathode (for instance, a rod-like or a tubular substrate to be externally coated). The hollow sputtering cathode will consist of a tubular sputtering target arranged coaxially inside a tubular intermediate support, so as to define a thin annular tight chamber to be filled with a gas of high-thermal conductivity (the tubular intermediate support being able to constitute part of the wall of a second tight chamber arranged against its external face, with an appropriate liquid coolant circulated therein).

The present invention also may be used with planar configurations, consisting of a planar sputtering target arranged in front of a planar intermediate support, so as to define a sheet-like tight chamber to be filled with the appropriate atmosphere of gas with high-thermal conductivity (the planar intermediate support forming part of the wall of a second tight chamber arranged against its remote face, with an appropriate liquid coolant circulated therein).

In the apparatus of the present invention, the anode may be constituted by the substrate proper (the substrate being grounded while the cathode is negatively biased to a high voltage), or alternatively by an intermediate grid interposed between the substrate and the cathode (the intermediate grid is grounded or positively biased, while the substrate is negatively or positively biased, or still left "floating").

BRIEF DESCRIPTION OF THE DRAWINGS

The accompanying drawings are diagrammatic illustrations by way of example of several embodiments of the apparatus according to the present invention.

SPECIFIC DESCRIPTION

Figure 1:
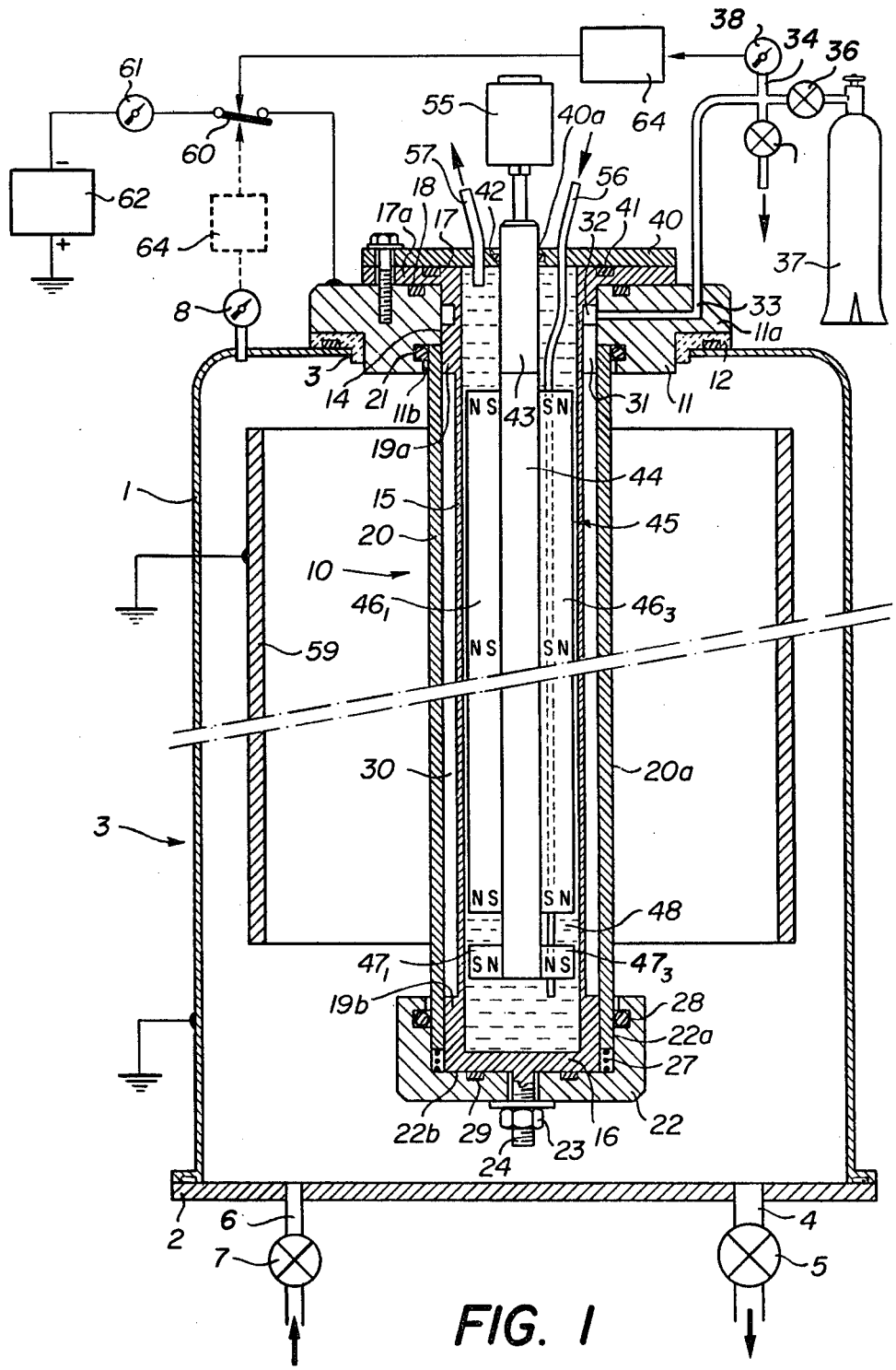
FIG. 1 is a diagrammatic sectional view of a first embodiment.
Figure 2:
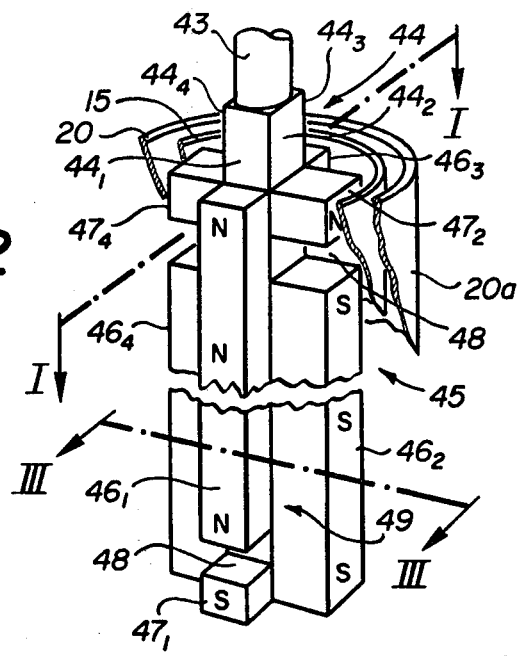
FIG. 2 is a perspective view of an element constitutive of the cathode of this first embodiment, drawn to a larger scale.
Figure 3:
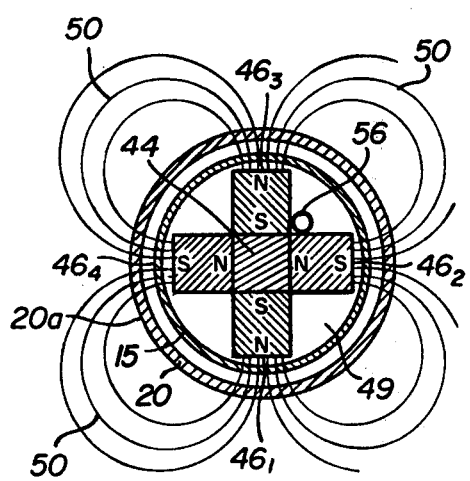
FIG. 3 is a cross-sectional view according to line III—III of FIG. 2.
Figure 4:
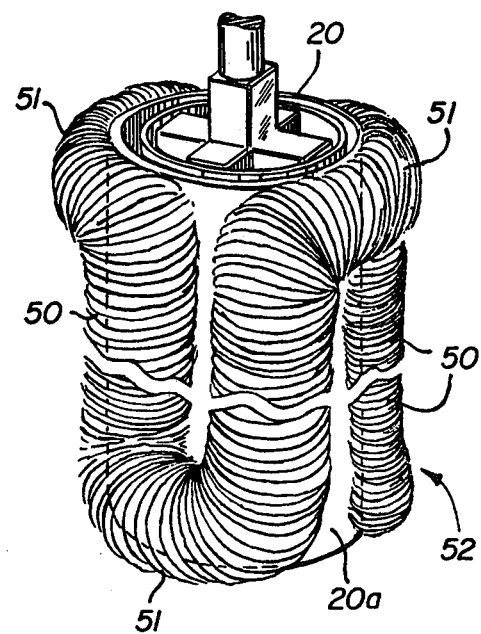
FIG. 4 is a perspective view similar to that of FIG. 2, showing the outside of said cathode.

FIGS. 1 to 4 relate to a first embodiment of the present invention, which uses a cylindrical magnetron sputtering cathode extending centrally inside the apparatus, so as to enable the coating of substrates disposed concentrically around the cylindrical cathode.

This first embodiment of FIGS. 1 to 4 comprises (FIG. 1) a bell jar 1 resting on a base plate 2, so as to form a sealed enclosure 3. The base plate 2 is provided with an evacuation port 4 connected via a valve 5 to a suitable pumping device (not shown), and with an inlet port 6 connected by a gauged valve 7 to a gas source such as argon (not shown). The bell jar 1 is provided with a pressure gauge 8.

Through a central circular opening 9 provided in the top of the bell jar 1 is introduced a cylindrical magnetron sputtering cathode 10, which extends centrally inside the sealed enclosure 3. This cylindrical cathode 10 comprises at its upper end a discoidal metal block 11, which rests by means of an external flange 11a on the border of the opening 9, via an insulating ring 12. The discoidal metal block 11 is provided with a central circular opening 14, through which is introduced a tubular sheath 15 with a flat bottom 16 and an open top 17, which rests by means of a top external flange 17a against the upper plane face of the block 11 (tightness between the flange 17a and the block 11 ensured by an O-ring 18). The tubular sheath 15, which is made of a high thermally conducting material such as copper, is provided at both lateral ends with thin external annular shoulders 19a and 19b designed for closely fitting the internal diameter of the central opening 14 of the block 11.

Around the tubular sheath 15 is coaxially mounted an open-ended tubular target 20 made of a material to be sputtered, internally designed for closely fitting the respective end-shoulders 19a and 19b of the tubular sheath 15. The upper end of the tubular target 20 protrudes inside an annular recess 11b provided in the lower part of the block 11 for enlarging the corresponding lower part of the opening 14, so that this upper end of target 20 is firmly inserted between the lateral wall of the recess 11b and the shoulder 19a of the tubular sheath 15 (the tightness between the target 20 and the block 11 is ensured by an O-ring 21 disposed in an annular groove provided in the lateral wall of recess 11b). The lower end of the tubular target 20, which rests by its internal wall against the end-shoulder 19b of sheath 15, is closely surrounded by the lateral wall 22a of a cup-shaped closing element 22, the bottom 22b of which is maintained in close contact against the bottom 16 of the sheath 15 by means of a nut 23 cooperating with a screw 24 integral with the bottom 16 (screw 24 protruding below the bottom 22b through a central hole provided in said bottom 22b). In the annular space between the shoulder 19b of the sheath 15 and the lateral wall 22a of the closing element 22 is mounted an annular spring 27, compressed between the bottom 22b of closing element 22 and the lower end of the target 20 so as to keep the upper end of the target 20 tightly inserted inside the recess 11b of the block 11, whatever the thermal dilatation likely to be incurred by the target 20 (the tightness between the lower end of target 20 and the lateral wall 22a of closing element 22 being ensured by an O-ring 28 disposed in an annular groove provided in the lateral wall 22a, while the tightness between the respective bottoms 16 and 22b is ensured by an O-ring 29 disposed in an annular groove provided in the upper face of bottom 22b).

The coaxially mounted tubular sheath 15 and tubular target 20 delimitate a thin annular gas or vacuum tight chamber 30 which axially extends from the top metal block 11 to the bottom closing element 22 of the sputtering cathode 10 (the tightness of the chamber 30 being ensured by the respective O-rings 18, 21, 28 and 29). The tubular sheath 15 and tubular target 20 are designed with respect to each other (adequate choice of the internal diameter of the target 20 with respect to the external diameter of sheath 15 and the thickness of the shoulders 19) so as to delimitate an annular chamber 30 presenting an internal thickness preferably comprised between 0.1 and 0.3 mm (the thickness is strongly exaggerated in the drawings for purposes of illustration).

This annular gas tight chamber 30 is connected to the outside of the sealed enclosure 3 by providing, in the upper end-shoulder 19a of the sheath 15, a plurality of equiangularly spaced axially extending channels 31 (two of them being shown in dotted lines on FIG. 1) emerging in an annular groove 32, which annular groove 32 freely communicates with the outside by means of a conduit 33 pierced through the block 11. The outside emerging end of the conduit 33 is connected to the first branch of a four-branch junction 34, the second branch is connected via a valve 35 to a suitable pumping device (not shown), the third branch is connected via a gauged valve 36 to a source 37 of a high thermally-conducting gas (such as helium), and the fourth branch is connected to a pressure gauge 38.

The open top 17 of the tubular sheath 15 is closed by a plane cover 40 resting on the upper plane face of the flange 17a (the tightness between the cover 40 and the flange 17a being ensured by an O-ring 41 disposed in an annular groove provided in the upper face of the flange 17a). Through a central circular opening 40a provided in the cover 40 is inserted a cylindrical stud 43 (the tightness between the cover 40 and the stud 43 being ensured by an adequate O-ring 42), to the lower end of which is connected a soft iron rod 44 with a square cross-section, which centrally extends inside the tubular sheath 15 substantially along the whole length of the annular chamber 30.

Around this soft iron central rod 44 is mounted a magnet assembly 45, designed for generating magnetic fields having flux lines which project in a curve from the outer sputtering face 20a of the tubular target 20 and return to form arch portions thereover (flux lines successively traversing the tubular sheath 15 and the tubular target 20 made of non-magnetic materials). This magnet assembly 45, which is better shown on the perspective view of FIG. 2 (magnet assembly 45 shown in FIG. 1 in a sectional view according to lines I—I of FIG. 2), consists of a plurality of equiangularly spaced axially extending radially magnetized magnets $46_1$ to $46_4$ and $47_1$ to $47_4$, which are arranged against the four longitudinal faces of the central rod 44 in the following manner:

parallelepipedic magnets $46_1$ and $46_3$, coupled by their south pole faces against the respective opposite faces $44_1$ and $44_3$ of the central rod 44 so as to have their north pole faces pointing in the vicinity of the inner wall of the tubular sheath 15, the parallelepipedic magnets $46_1$ and $46_3$ extending along the central rod 44 from its upper end portion to an intermediate portion situated immediately upward its lower end portion, parallelepipedic magnets $46_2$ and $46_4$, coupled by their north pole faces against the respective opposite faces $44_2$ and $44_4$ of the central rod 44 so as to have their south pole faces pointing in the vicinity of the inner wall of the tubular sheath 15, the parallelepipedic magnets $46_2$ and $46_4$ extending along the central rod 44 from its lower end portion to an intermediate portion situated immediately below its upper end portion, cubic end-magnets $47_1$ and $47_3$, coupled against the lower end portion of the respective opposing faces $44_1$ and $44_3$ of the central rod 44 so as to extend in the prolongation of the corresponding parallelepipedic magnets $46_1$ and $46_3$ while being separated from the latter by gaps 48, the cubic end-magnets $47_1$ and $47_3$ being coupled by their north pole faces against the lower end portions of the opposing faces $44_1$ and $44_3$ so as to have their south pole faces pointing in the vicinity of the inner wall of the tubular sheath 15, and, cubic end-magnets $47_2$ and $47_4$, coupled against the upper end portion of the respective opposing faces $44_2$ and $44_4$ of the central rod 44 so as to extend in the prolongation of the corresponding parallelepipedic magnets $46_2$ and $46_4$ while being separated from the latter by gaps 48, the cubic end-magnets $47_2$ and $47_4$ being coupled by their south pole faces against the upper end portions of the opposing faces $44_2$ and $44_4$ so as to have their north pole faces pointing in the vicinity of the inner wall of the tubular sheath 15.

The above described plurality of magnets $46_1$ to $46_4$ and $47_1$ to $47_4$ constitutive of the magnet assembly 45 inserted inside the tubular sheath 15 is arranged to generate flux lines which form over the outer sputtering face 20a of the tubular target 20 (FIGS. 3 and 4) four equiangularly spaced axially extending straight arch portions 50 alternately connected to one another by four arcuate arch end-portions 51, whereby defining a single closed-loop arch 52 extending in a meandering manner over the entire circumference of the sputtering face 20a of the tubular target 20.

The upper end of the cylindrical stud 43 protruding outside the cover 40 is connected (FIG. 1) to the shaft of a motor 55, designed for slowly rotating the magnet assembly 45 according to a to-and-fro rotatory movement, of an amplitude sufficient (about ±45°) for enabling the single closed-loop arch 52 generated by the magnet assembly 45 to be periodically scanned over the entire surface of the sputtering face 20a.

The closed tubular sheath 15 containing the magnet assembly 45 is provided with a circuit for circulating a liquid coolant therein, such as cold water. This circuit comprises at least one admission conduit 56 extending from the outside of the cover 40 to near the bottom 16 of the sheath 15 (while traversing the magnet assembly 45 by extending along the corner of one of the longitudinal spaces 49 delimitated between the equiangularly spaced magnets 46 and 47), so as to bring the liquid coolant down to the bottom 16 of said sheath 15 (outside protruding end of the conduit 56 connected to a suitable liquid coolant source not shown on the drawing). The liquid coolant brought down to the bottom 16 can freely flow upwards, by circulating along the free longitudinal spaces 49 delimitated between the equiangularly spaced different magnets 46 and 47, before being evacuated through an evacuating port 57 provided in the cover 40.

Inside the sealed enclosure 3 is disposed a tubular metal substrate 59 to be internally coated, arranged coaxially around the tubular target 20 of the central cylindrical cathode 10. The tubular metal substrate 59 is connected to ground (as well as the metal enclosure 3), while the central cathode 10 is connected via a switch 60 and an ammeter 61 to the negative pole of a high-voltage source 62 whose other pole is also grounded.

The above apparatus comprises a control circuit 64, respectively connected by its input to the pressure gauge 38 and by its output to the switch 60. This control circuit 64 is designed for triggering the opening of the switch 60, as soon as the pressure recorded by the gauge 38 undergoes a sudden decrease with respect to a predetermined value.

The above described sputtering apparatus operates in the following manner:

The cylindrical cathode 10 is provided with a new target 20, the sealed enclosure 3 is evacuated and an argon atmosphere of about $10^{-4}$ to $10^{-2}$ torr is introduced therein. Concurrently, the annular chamber 30 of the cathode 10 is evacuated (by pumping means connected to the valve 35) and an helium atmosphere of about 10 torr is introduced therein (by means of the gauged valve 36 connected to the helium source 37).

The liquid coolant is circulated inside the tubular sheath 15 of the cathode 10, the switch 60 is closed, thereby causing the application of a negative high voltage to the cathode 10.

The negative biasing of the cathode 10 produces a glow discharge which causes ionization of the argon atoms. The argon ions bombard the sputtering face 20a of the tubular target 20, thereby causing the ejection (or sputtering) of atoms from the sputtering face 20a, which sputtered atoms are deposited by condensation on the internal face of the tubular substrate 59.

The presence of the magnet assembly 45 inside the cylindrical cathode 10 confines the discharge plasma (ionization region) within the closed-loop endless arch 52 formed over the sputtering face 20a by the flux lines of the magnet assembly 45, while producing a high intensification of the discharge plasma. The formation of an intense and confined discharge plasma is explained by the fact that the closed-loop endless arch 52 generated by the magnet assembly 45 acts, with respect to the secondary electrons emitted by the target 20, as a trapping means which compels the secondary electrons to circulate along an extended continuous path around the sputtering surface 20a instead of directly migrating towards the anode, thereby drastically increasing the probability of ionizing collisions with argon atoms. The production of the intense and confined discharge plasma results in an intense ion bombardment of the sputtering face 20a of the target 20 (large ion current bombardment of the cathode), whereby causing an intense sputtering of the target 20, and the coating with a high deposition rate of the internal face of the tubular substrate 59.

The intense ion bombardment to which the target 20 is submitted causes a high power dissipation at the target, thereby requiring a sufficient target cooling throughout the sputtering to prevent any risk of damage (possible deterioration of the target 20, too high radiative heating of the substrate 59, or possible demagnetization of the magnet assembly 45). The target cooling throughout the sputtering is ensured by the double cooling system comprising the closed tubular sheath 15 containing the magnet assembly 45, which is provided with a liquid coolant circuit, and the thin annular chamber 30 coaxially extending between this tubular sheath 15 and the back of the target 20, which is provided with an atmosphere of a high thermally conducting gas, such as helium. The interposition of a thin stagnant helium layer between the target 20 and the sheath 15, despite the high power dissipation at the target, allows for a permanent heat transfer from the target 20 to the sheath 15 (through the helium layer), which is enough to keep the temperature of the target 20 down to maximum permissible values of about 500° C., provided that the temperature of the sheath 15 is kept about the ambient value. The low temperature of the sheath 15 is ensured by the liquid coolant circulated inside the sheath 15, which continuously evacuates towards the outside the heat continuously transferred through the thin helium gas layer. The evacuation of the heat towards the outside allows the liquid coolant to freely circulate along the longitudinal spaces 49 delimitated between the equiangularly spaced different magnets 46 and 47, i.e. along longitudinal spaces 49 which extend in front of the regions of the target 20 where the sputtering and the power dissipation is the more intense.

During the sputtering the target 20 undergoes an erosion, which would otherwise remain localized in the regions of the target covered by the closed-loop confined discharge plasma (i.e. in the regions covered by the closed-loop arch 52 formed by the flux lines of the magnet assembly 45). However, the motor 55 which slowly rotates the magnet assembly 45 according to an oscillatory rotatory movement with respect to the target 20 ensures a uniform erosion of the target 20 (resulting in an improved target life), by periodically scanning the closed-loop arch 52 (and the intense discharge plasma confined inside the arch 52) over the entire surface of the sputtering face 20a. The uniformity of the target erosion is improved by a single closed-loop plasma meandering over the entire circumference of the sputtering face, thereby resulting in a practically uniform plasma current along its whole path. The motor 55 which slowly rotates the magnet assembly 45 results in a similar oscillatory rotational movement of the magnet assembly 45 with respect to the substrate 59, thereby producing excellent uniformity of internal coating of the substrate 59.

When the substrate 59 is provided with a uniform coating of desired thickness, the sputtering operation is stopped to replace the coated substrate with a new one, and the sputtering operation can then be immediately resumed. Throughout the successive coating of different substrates, the sputtering target 20 continues to be progressively eroded, until it is eventually pierced. Such a piercing is totally harmless to the sputtering apparatus or the substrates being coated, since it results in a simple irruption of helium inside the sealed enclosure 3, which is at once detected by the pressure gauge 38 (gauge 38 detecting a sudden decrease of helium pressure inside the annular chamber 30) and the controlling circuit 64 will automatically open switch 60 of the sputtering apparatus. The consumption and the life of pierced target 20, has been optimized and can be immediately removed from the sealed enclosure and replaced by a new one, and the sputtering operation can then be resumed.

In the above described operation, the coating of each substrate 59 may be preceded by a cleaning step, which is performed by negatively biasing the substrate 59 while the cylindrical cathode 10 is grounded (the biasing, which is the reverse of that applied during the coating, giving rise to a glow discharge causing the proper sputtering of the substrate).

According to a variation of the above described embodiment, the control circuit 64 may be replaced by a control circuit 64' (shown in dotted lines on FIG. 1) having its input connected to the pressure gauge 8 provided in the enclosure 3 (instead of being connected to the pressure gauge 38), so as to control the automatic switch-off of the sputtering apparatus as soon as this gauge 8 detects a sudden increase of pressure inside the sealed enclosure 3 (instead of detecting a sudden decrease of pressure inside the annular chamber 30).

According to another variation of the above described embodiment, the means for detecting the sudden irruption of helium inside the main enclosure is constituted by spectroscopic means for observing the appearance of the characteristic light likely to be emitted at the instant of target piercing (characteristic light likely to be emitted by helium when submitted to a glow discharge at its entrance inside the main enclosure). Such spectroscopic means, which may consist of a photoelectric cell fitted with an appropriate optical filter (not shown on the drawing), will be connected to the control circuit 64, so as to control the automatic switch-off of the sputtering apparatus as soon as the appearance of the characteristic light is detected.

In another variation of this embodiment, the motor 55 may be designed for rotating the assembly 45 according to a unidirectional rotatory movement instead of the to-and-fro rotatory movement previously described (the admission conduit 56 extending along one of the channels 49 of the magnet assembly 45 is replaced by a borehole, pierced through the stud 43 and the rod 44 so as to axially extend from the upper end of the stud 43 to the lower end of the rod 44), so as to cause full revolutions of the magnet assembly 45 with respect to the tubular target 20 and the substrate 59, thereby resulting in good uniformity of target sputtering and substrate coating.

EXAMPLE

The sputtering apparatus of FIGS. 1 to 4 is used for depositing a stainless steel coating of about 10 um thick (for corrosion protection purposes) on the internal surface of soft iron tubes having a length of about 400 mm and an internal diameter of about 70 mm.

The sputtering apparatus of FIGS. 1 to 4 uses a cylindrical cathode 10 with the following structural parameters:

tubular sheath 15 made of copper, with an external diameter of about 31.6 mm, tubular target 20 made of 18/8 stainless steel (stainless steel 304 according to U.S. designation), with an internal diameter of about 32 mm (tubular sheath 15 and tubular target 20 therefore delimitating an annular chamber 30 having a thickness of about 0/2 mm), which tubular target 20 presents an initial thickness of about 1.5 mm, as well as an overall length of about 500 mm (tightness at both ends ensured by O-rings 21 and 28 made of Viton), magnet assembly 45 designed so as to generate in the vicinity of the sputtering face 20a of the target 20 magnetic fields having a strength of about 300 to 800 ersteds (depending on the actual erosion level of the target), the magnet assembly 45 being arranged inside the target 20 so as to cause the erosion of the target along a length of about 450 mm.

The pressure gauge 38 provided in this sputtering apparatus is made by Balzers (model #APGO1O/A-PRO1O), covering the range of 0.1 to 1000 mbar and giving an electrical output signal of 100 mV at 10 mbar (output signal connected to the controlling circuit 64).

A first soft iron tube 59 to be coated is arranged concentrically around the cylindrical cathode 10, the sealed enclosure 3 is evacuated to a pressure of about $1 \times 10^{-5}$ mbar (via the valve 5), simultaneously with the chamber 20 (via the valve 35). The evacuating operation once terminated, the valve 35 is closed, and an atmosphere of helium up to a pressure of the order of 10 mbar is introduced inside the chamber 10 (via the gauged valve 36), while an atmosphere of argon up to a pressure of the order of $2 \times 10^{-2}$ mbar is simultaneously provided inside the main enclosure 3 (via the valve 7).

The soft iron tube 59 is submitted to a short cleaning prior to its coating, by biasing the iron tube 59 to a value between $-500$ to $-1000$ volts while the magnetron cathode 10 is grounded (the glow discharge appears between the tube and the magnetron cathode being maintained during about 5 min., so as to cause a sputtering of the internal surface of the tube which is sufficient for properly cleaning it).

After the cleaning (by switching off the biasing), the pressure of argon inside the main enclosure 3 is decreased up to a value of about $4 \times 10^{-3}$ mbar, to perform the coating proper of the tube 59. For that purpose, the tube 59 is grounded, while the magnetron cathode 10 is connected via the switch 60 (as shown on the drawing) to the negative pole of a DC power supply 62 delivering up to 12 amps at about 500 volts (the power supply 62 being protected against arcing by a current limiter). The deposition rate onto the internal surface of the tube is about 6 um per kWh consumed, while the corresponding target erosion rate is about 12 um per kWh consumed. Using a power of 6 kW, the desired coating of about 10 um thick is deposited onto the internal surface of the tube in about 17 min. The maximum temperature reached by the target is about 500° C. in the sputtering zone, while not exceeding 200° C. at both ends (i.e. in the vicinity of the O-rings 21 and 28).

The above operations are cyclicly repeated for the coating of successive tubes 59, thereby leading to a progressive erosion of the target 20, up to its piercing after about 20 hours of operation. At the exact instant of piercing, the sudden irruption of helium inside the main enclosure 3 is immediately detected by the fast reacting gauge 38, the output signal of which switches off the sputtering apparatus. The consumed target 20 is then replaced and the deposition continued without any damage to the tubes being coated.

Figure 5:
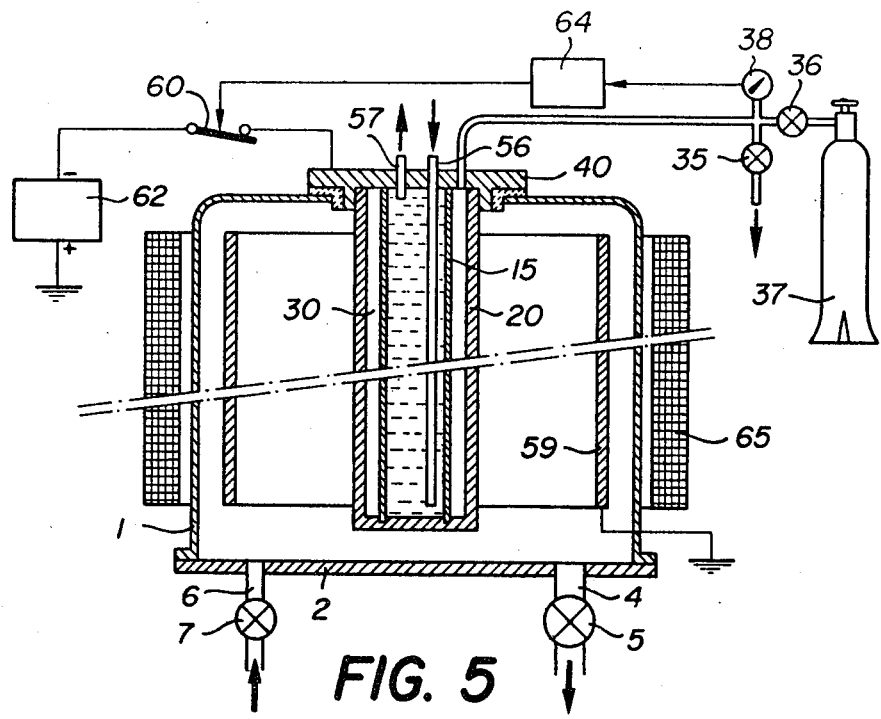
FIG. 5 is a diagrammatic sectional view similar to that of FIG. 1, illustrating one variation of the first embodiment.

FIG. 5 illustrates another variation of the first embodiment of FIGS. 1 to 4 (the unchanged elements maintain the same figures of reference on the drawing), wherein the magnet assembly 45 inserted inside the central cylindrical cathode 10 is replaced by a coil 65 of the Helmholtz-type disposed concentrically outside the bell jar 1 (bell jar 1 made of a non-magnetic material such as stainless steel), so as to ensure the generation of an axial uniform magnetic field inside the annular interspace extending between the target 20 and the substrate 59. The operation of this apparatus of FIG. 5 is similar to that previously described, except that the sputtering rates obtained are substantially lower, because of the uniformity of the magnetic field which causes a simple intensification, but without confinement, of the discharge plasma (coil 65 also acting as a means for enhancing the discharge plasma, but in a lesser manner than the magnet assembly 45). The apparatus of FIG. 5 is limited to the coating of tubular substrates 59 made of non-magnetic materials (substrate 59 as well as bell jar 1 having to be non-magnetic, in order not to shield the magnetic field generated from the outside by the coil 65).

Figure 6:
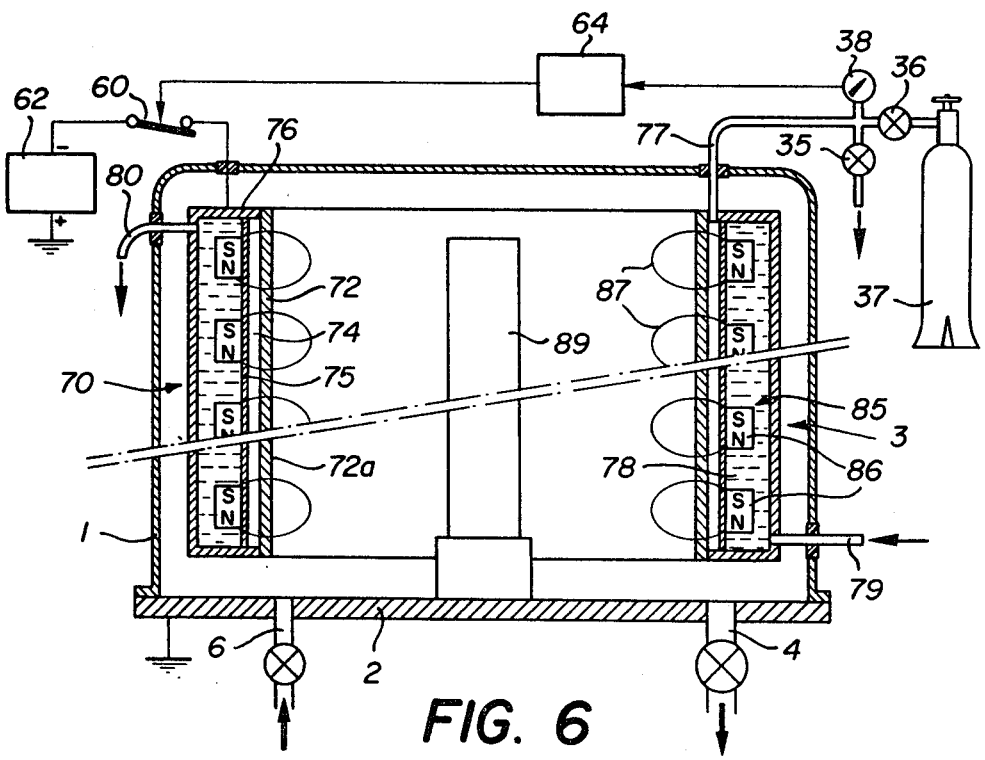
FIG. 6 is a diagrammatic sectional view similar to that of FIG. 1 illustrating a second embodiment.

FIG. 6 shows a second embodiment of the apparatus of the present invention, which comprises a hollow magnetron sputtering cathode disposed concentrically around the axis of the apparatus, so as to enable the external coating of substrates centrally extending along the axis (the elements of the embodiment of FIG. 6 which are unchanged with respect to those of FIGS. 1 to 4 maintain the same reference numerals).

The embodiment of FIG. 6 comprises a bell jar 1 resting on a baseplate 2 so as to form a sealed enclosure 3, as well as an evacuation port 4 and an inlet port 6 provided in the baseplate 2. Inside the sealed enclosure 3 is disposed a hollow magnetron sputtering cathode 70, extending concentrically around the vertical axis of said enclosure 3. This hollow cathode 70 comprises a tubular target 72 made of a material to be sputtered, concentrically arranged inside a tubular intermediate support 75. The tubular target 72 extends a short distance from the tubular support 75, so as to delimitate in combination therewith a thin first gas tight chamber 74 (chamber 74 closed at both ends by flanges 76 radially protruding from the support 75). This gas tight chamber 74 is connected to the outside of the sealed enclosure 3 by means of a conduit 77, which is connected in the same manner as previously described (i.e., respectively, to suitable pumping means via the valve 35, to the helium source 37 via the gauged valve 36, and to the pressure gauge 38).

The tubular intermediate support 75 forms part of the wall of a second fluid tight chamber 78 adjoining the first gas tight chamber 74, which second chamber 78 is provided with an admission conduit 79 and an evacuation conduit 80 for enabling the circulation of a liquid coolant such as cold water therein. Inside the chamber 78 is mounted a magnet assembly 85, consisting of a plurality of equiaxially spaced circumferentially extending axially magnetized ring magnets 86. These ring magnets 86 are coupled against the back-face of the tubular support 75 so as to generate magnetic fields having flux lines which form a plurality of equiaxially spaced toroidal arches 87 circumferentially extending over the sputtering face 72a of the tubular target 72.

Centrally inside the sealed enclosure 3 is disposed a cylindrical substrate 89 to be externally coated. This central substrate 89 is connected to ground, while the hollow cathode 70 is connected as previously described (via the switch 60) to the negative pole of the high-voltage source 62 whose other pole is also grounded. The apparatus of FIG. 6 is provided with the control circuit 64, respectively connected at its input to the pressure gauge 38 and at its output to the switch 60.

The operation of this apparatus is in many respects similar to that previously described. The sealed enclosure 3 and the first tight chamber 74 are provided with an atmosphere of argon of the order of $10^{-4}$ to $10^{-2}$ torr and with an atmosphere of helium of the order of 10 torr, the liquid coolant is then circulated inside the second right chamber 78 while a negative high voltage is applied to the hollow cathode 70 (by closing the switch 60). The application of the negative high voltage leads to the formation of a plurality of intense ring plasmas confined within the toroidal arches generated by the ring magnets 86 over the inner face 72a of the target 72, thereby causing an intense sputtering of the corresponding regions of the target 72, and a high-rate coating of the central substrate 89 (target 72 is likely to be uniformly eroded because of the to-and-fro axial motion of the magnets 86 with respect to the target 72).

Throughout the intense sputtering, excessive heating of the target 72 is prevented by the double cooling system provided in the apparatus (the atmosphere of a high thermally conducting gas such as helium provided in the thin first chamber 74 adjoining the back face of the target 72, and the liquid coolant conduit provided in the second chamber 78 adjoining the first chamber 74). The target cooling carried out is less satisfactory than that obtained with the embodiment of FIGS. 1 to 4, since now the liquid coolant cannot circulate along the portions of the support 75 against which the magnets 86 are coupled, i.e. along the portions of the support 75 which extend in front of the portions of the target 72 where the sputtering and the heating up is the more intense. A better target cooling could be obtained by arranging the magnets 86 at some distance from the support 75 instead of coupling them directly against it, but this would be done at the expense of the magnetic field likely to be applied over the sputtering face 72a of the target 72, the intensity of which might be too low for an efficient enhancing of the discharge plasma.

The above sputtering operation proceeds (throughout the coating of successive substrates 89) up to the piercing of the target 72, which piercing may then occur without any damage to the sputtering apparatus and/or the substrate 89 being coated, because of the immediate and automatic shut-off of the sputtering process by the control circuit 64. The optimally consumed target 72 can be replaced and the sputtering process immediately resumed.

Figure 7:
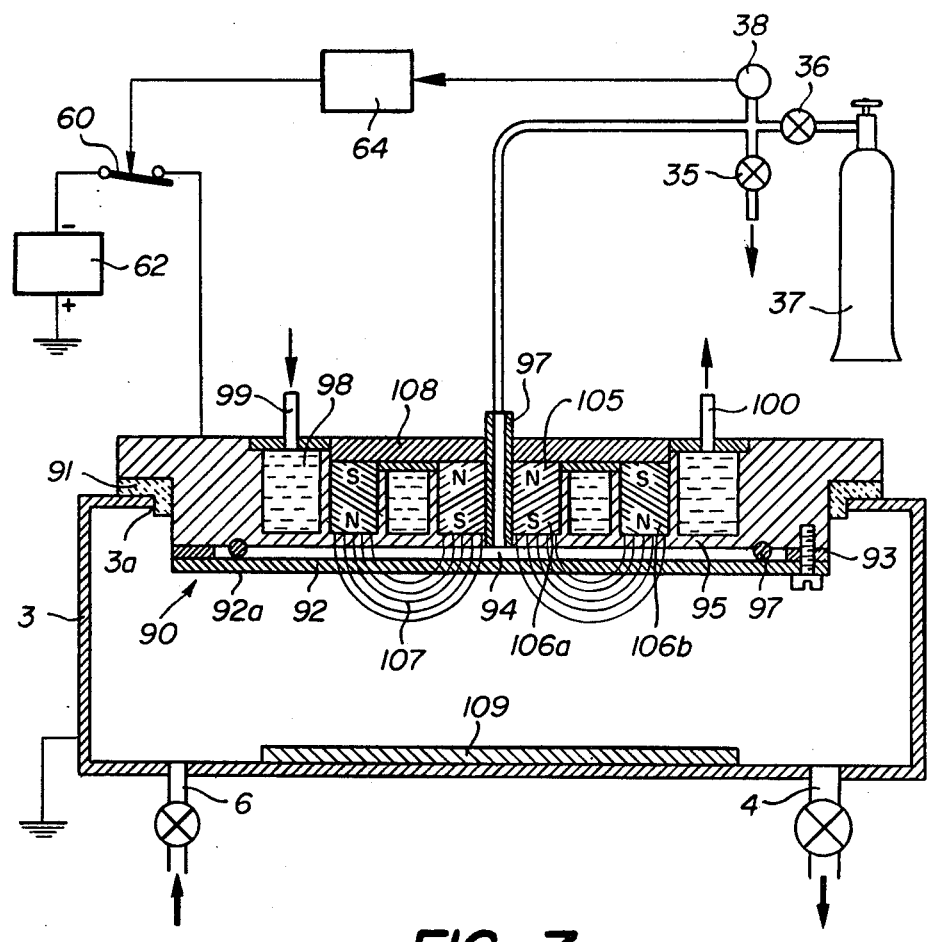
FIG. 7 is a diagrammatic sectional view similar to that of FIG. 1, illustrating a third embodiment.

FIG. 7 relates to a third embodiment of the apparatus of the present invention, using a planar magnetron sputtering cathode designed for enabling the coating of a planar substrate disposed in front of the cathode (the elements of said embodiment unchanged with respect to those of FIGS. 1 to 4 maintain the same figures of reference on the drawing).

This embodiment of FIG. 7 comprises a sealed enclosure 3, respectively provided with an inlet port 4 and an evacuation port 6. Through a circular opening 3a provided in the top of the enclosure 3 is introduced a planar magnetron sputtering cathode 90 of circular cross-section (electrically separated from the enclosure 3 by means of an insulating ring 91). This planar cathode 90 comprises a discoidal target 92 made of a material to be sputtered, arranged in the vicinity of the lower planar face of an intermediate support 95 so as to delimitate in combination therewith a thin gas tight chamber 94 (the appropriate spacing between the target 92 and the support 95 being ensured by annular spacing element 93, while the tightness of said chamber 94 is ensured by an appropriate O-ring 97).

The intermediate support 95 forms part of the wall of a plenum 98 adjoining the gas tight chamber 94, which plenum 98 is provided with an admission port 99 and an evacuation port 100 for enabling the circulation of a liquid coolant therein. Against the back face of the plenum 98 is mounted a magnet assembly 105, consisting of a central discoidal magnet 106a surrounded by annular magnet 106b. These concentric magnets 106a and 106b are axially magnetized in a reverse direction from each other, so as to generate magnetic fields, the flux lines of which form a closed loop toroidal-shaped arch 107 over the planar sputtering face 92a of the target 92. The magnet assembly 105 further comprises a discoidal soft iron plate 108 extending on the upper surface of the magnets 106a and 106b for closing the flux lines on the upper side.

The gas tight chamber 94 is connected to the outside of the enclosure 3 by means of a conduit 97 extending through the central magnet 106a and the plate 108, which conduit 97 is connected in the same manner as previously described (i.e., respectively, to suitable pumping means via the valve 35, to the helium source 37 via the gauged valve 36, and to the pressure gauge 38).

Against the bottom of the enclosure 3 is disposed a discoidal substrate 109. This substrate 109 is connected to ground, while the sputtering cathode 90 is connected via the switch 60 to the negative high voltage source 62 while the other pole is grounded. The apparatus is provided with the control circuit 64, respectively connected to the pressure gauge 38 and to the switch 60.

The operation of the above described apparatus is in many respects similar to those previously described, so that no further description is necessary.

Although the present invention has been specifically disclosed with preferred embodiments and drawings, variations of the concepts herein disclosed may be resorted to by those skilled in the art and such variations are considered to be within the scope of the invention and appended claims.

I claim:

1. An improved sputtering cathode for a high rate sputtering apparatus for substrate coating, adapted to be located inside an evacuable sealed enclosure, the cathode having means for target cooling during sputtering and means for enhancing the sputtering rate, the target having a sputtering face of a material to be sputtered and a back face opposed to the sputtering face, wherein the improvement comprises:

a first, thin gas tight chamber formed by the back face of the target and an intermediate support, adapted to have a gas of high thermal conductivity therein;

a second, fluid tight chamber formed in part by the intermediate support, adapted to have a liquid coolant circulating therein; and a means for detecting the escape of the gas of high thermal conductivity from the first chamber.

2. An improved sputtering cathode as in claim 1 further comprising means to switch off the sputtering immediately once the escape of the gas has been detected.

3. An improved sputtering cathode as in claim 1 wherein the sputtering cathode has a cylindrical shape, the sputtering target and the intermediate support are tubular and coaxial, and together delimitate said thin, first chamber.

4. An improved sputtering cathode as in claim 3 wherein the intermediate support is located inside the tubular target.

5. An improved sputtering cathode as in claim 3 wherein the tubular target is located inside of the intermediate support.

6. An improved sputtering cathode as in claim 1 wherein the sputtering cathode has a planar shape, whereby the sputtering target and the intermediate support are planar, and together delimitate said thin, first chamber.

7. An improved sputtering cathode is in claim 1 in which the detecting means comprises:
   means for detecting a sudden rise of pressure inside the sealed enclosure.

8. An improved sputtering cathode as in claim 1 in which the detecting means comprises:
   means for detecting a sudden decrease of pressure inside the first tight chamber.

9. An improved sputtering cathode as in claim 1 in which the detecting means comprises:
   spectroscopic means for detecting the characteristic light emitted by the high thermally conductive gas as it escapes into the sealed enclosure.

10. An improved sputtering cathode as in claim 1 wherein the enhancing means includes magnetic field means.

* * * * *